ELECTRICAL COUNTER FOR DIMINISHING COUNTS

Filed Dec. 19, 1957

INVENTORS
MITCHELL P. MARCUS
FRANCIS O. UNDERWOOD

BY Paul M. Brannen
AGENT

United States Patent Office 2,889,987

Patented June 9, 1959

2,889,987

ELECTRICAL COUNTER FOR DIMINISHING COUNTS

Mitchell P. Marcus, Johnson City, and Francis O. Underwood, Vestal, N.Y., assignors to International Business Machines Corporation, New York, N.Y., a corporation of New York Application December 19, 1957, Serial No. 703,800

6 Claims. (Cl. 235—132)

Figure 1:
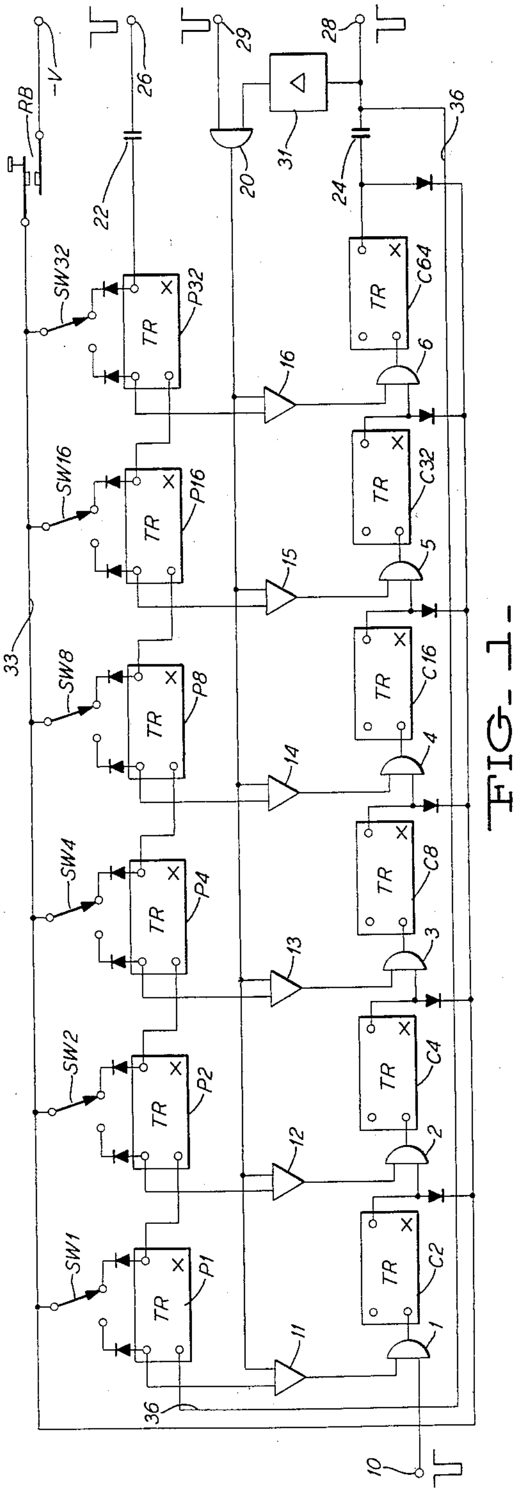

This invention relates to electrical counters, and particularly to an electrical counter arranged to provide diminishing counts, that is, to provide, following a given output, a succeeding output on a diminishing number of input pulses. More particularly, this invention provides an electrical counter in which a first output pulse is obtained following any desired $n$ input pulses, the next output is obtained when $n-1$ input pulses have been supplied; the third output pulse is obtained when $n-2$ input pulses have been supplied, and so on. Following the output pulse which is obtained on a single input pulse, the apparatus may be arranged to stop counting, or to repeat the counting procedure with the same or some new value of $n$.

It has been previously proposed to provide reversible counters in which successive counts may reduce output values or preset counters in which various preset numbers may be counted, but no arrangement in the prior art is known which will provide the results described above.

In the present invention, these results are obtained by providing two cascades or chains of counting devices, which may be electronic counter stages employing vacuum or gas tubes, or may be solid state devices such as transistor or magnetic core counter stages. The first chain or counting chain is arranged in the usual manner to count input pulses which are passed in cascade fashion, through the counting chain, each successive counting stage producing an effective output pulse for some integral multiple of input pulses. In addition to the input pulses to be counted, hereinafter referred to as the counter input pulses, each counting stage is arranged to be selectively supplied with a delayed pulse fed back from the final counting stage. The selection of the counting stage to which these delayed feed-back pulses are supplied is governed by the condition of an associated presetting stage, which stages, like the counter stages, are counting devices arranged in cascade in a second chain.

In a preferred embodiment of the invention, prior to starting the counting operation, all stages in the counting chain are set to a first or Off condition, and selected ones of the presetting stages are set in a second or On condition, while the others are set to the Off condition, all as a result of supplying a resetting pulse over suitable connections. By this action, a value of $2^m-n$ may be preset in the presetting chain, where $m$ is the number of binary stages in the presetting chain and also in the counting chain and $n$ is any integer value from zero to a value equal to $2^m-1$.

Having set the value of $2^m-n$ into the presetting chain, an initial preset pulse, or transfer pulse is effective to set the counter stages in like condition to their associated presetting stages, so that the value $2^m-n$ is now entered into the counting chain. The counting input pulses may then be supplied to the input of the first stage of the counting chain, and the successive pulses will be counted, taking into account the number $2^m-n$ already in the chain, to produce an output pulse after $n$ counter input pulses have been supplied. This output pulse, which may be utilized for any suitable output purpose, is also supplied to the input of the presetting chain, and accordingly increases the value of $2^m-n$ in the presetting chain by one. A delayed output pulse supplied to suitable switches, connects the stages of the presetting chain to the counting chain stages so that the value of $2^m-n+1$ is entered in the counting chain. Accordingly, the next set of counter input pulses will produce an output when $n-1$ pulses have been supplied. This diminishing counting will continue until, finally, a single counter input pulse will produce a counter output pulse. This pulse, when fed to the pre-setting chain, will also produce an output pulse from the last stage in the presetting chain, which pulse may be employed for control purposes, such as setting a new initial value of $2^m-n$ in the presetting chain, etc.

It is accordingly an object of this invention to provide an electrical counter which is capable of providing a diminishing count for each successive group of inputs supplied thereto.

Another object of the invention is to provide an electrical counter which is capable of counting $n$ pulses, where $m$ is the number of binary counting stages therein, and $2^m-n$ is a predetermined number which is automatically increased by one for each group of pulses which are counted, to thereby decrease $n$ by 1.

A further object of the invention is to provide an electrical counter in which two parallel chains of binary devices are utilized, one for counting input pulses, and the other for setting a number into the counting chain, which number is successively increased by the auxiliary or presetting chain for each output from the counting chain.

Another object of the invention is to provide an electrical counter in which two parallel chains of binary devices are utilized, one for counting input pulses, and the other for setting a number into the counting chain, which number is successively increased by the auxiliary or presetting chain for each output from the counting chain, by selectively connecting the corresponding stages in each chain.

Another object of the invention is to provide an improved electrical counter for providing diminishing counts of input pulses.

Other objects of the invention will be pointed out in the following description and claims and illustrated in the accompanying drawings, which disclose, by way of examples, the principle of the invention and the best mode, which has been contemplated, of applying that principle.

In the drawings:

Fig. 1 is a diagrammatic illustration of an electrical counter, in accordance with a preferred embodiment of the invention.

Figure 2B:
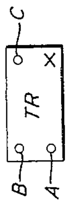
Figure 2A:
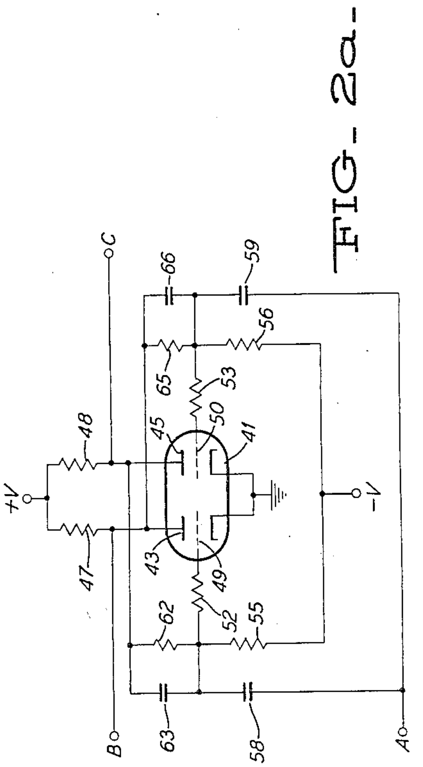

Figs. 2*a* and 2*b* are diagrammatic illustrations of the circuit and symbolic representation, respectively, of one type of binary device which may be employed in the arrangement shown in Fig. 1.

Similar reference characters refer to similar parts in each of the several views.

Referring to Fig. 1, there is shown two parallel chains of binary counting devices, each chain including a plurality of similar stages, with the output of any one stage connected to the input of the next stage. In the embodiment shown, six stages are provided in each chain, which provides a maximum count of $2^6=64$. The lower chain is termed the counting chain and includes stages C2, C4, C8, C16, C32 and C64. The upper chain is termed the presetting chain and includes stages P1, P2, P4, P8, P16, and P32. The inputs to each of the counting stages is taken from an Or circuit associated with the stage, and designated by the semicircles 1, 2, 3, 4, 5 and 6. These Or circuits are well known in the art and may take any one of a number of forms, but is deemed sufficient to say that they are connected and arranged so that an output is provided therefrom, on the line leaving the convex side of the symbol, when any one or all of the inputs to the straight side of the symbol are energized. One of the two inputs to each of the Or circuits, 2 through 6, is connected to the output of the preceding counter stage. The first Or circuit, 1, has one of its inputs connected to an input terminal 10, to which incoming pulses are supplied for counting. The other input of each Or circuit, 1 through 6, is connected to the output of an associated And circuit, indicated by the triangular symbols designated by reference characters 11, 12, 13, 14, 15 and 16. The And circuits, just as the Or circuits, are well known and need no detailed description, it being sufficient to note that an output is supplied on the line leaving the apex of the triangle when and only when all of the input lines entering the base of the triangle are energized.

One of the inputs to each of the And circuits, 11 through 16, is connected or bussed to the output of an Or circuit 20. The other input of each of these And circuits is connected to an output terminal of the associated presetting chain stage, i.e., 11 to P1, 12 to P2, etc.

The output terminals of the last stages P32 and C64 in the two chains are capacity coupled via capacitors 22 and 24, respectively, to output terminals 26 and 28 respectively. Terminal 26 may be further designated as the control output terminal, and terminal 28 may be further designated as the counter output terminal. One input of Or circuit 20 is connected to terminal 29, which may be further designated as the initial preset or transfer pulse terminal. The other input of Or circuit 20 is connected to terminal 28 via a delay unit 31. This device is only shown symbolically since any type of pulse delay device may be used, such as a lumped parameter transmission line for example, and it suffices to say that the device functions to delay, by a predetermined time interval, the passage of a pulse from terminal 28 to Or circuit 20.

The output pulses supplied to terminal 28 are also supplied over a line 36 to the input of the first stage P1 of the presetting chain.

The remaining apparatus includes a reset push button RB or other circuit closer, which when actuated connects, for a short time, a source of negative potential —V to a line 33, which supplies a reset pulse to each of the counting stages C2, C4, C8, C16, C32, C64, and additionally, sets the stages of the presetting chain in accordance with the associated setting switches SW1, SW2, SW4, SW8, SW16, and SW32. To eliminate back-circuit effects, each connection which is made to line 33 includes a diode, as shown, poled to pass negative pulses from line 33 to the device in question.

In the embodiment disclosed, it will be assumed for the sake of the description that negative-going pulses are employed throughout, as indicated at the various input and output terminals.

Before explaining the operation of the counter as a whole, the construction and operation of a typical trigger or flip-flop circuit which may be employed will be given. The circuit diagram for such a trigger is shown in Fig. 2*a*, and the corresponding symbol is shown in Fig. 2*b*, so that wherever the symbolic representation of Fig. 2*b* is encountered in Fig. 1, it will be understood that the actual circuitry corresponds to Fig. 2*a*. Referring to Fig. 2*a*, a duo-triode vacuum tube 41 has the cathodes thereof commoned and connected to a ground or neutral potential. The left-hand and right-hand anodes or plates 43 and 45 respectively, are connected to the positive terminal +V of a source of direct current through the anode resistors 47 and 48 respectively, the negative terminal of this source, not shown, being connected to ground. The left and right control grids 49 and 50 are connected to a source of bias potential —V through the current limiting resistors 52 and 53 and bias return resistors 55 and 56 respectively. The two grids are connected to a common input terminal A via the current limiting resistors 52 and 53, and input coupling capacitors 58 and 59. As is usual in trigger circuits, cross coupling networks are provided, comprising resistor 62 and capacitor 63 connecting the plate 45 and grid 49, and resistor 65 and capacitor 66 connecting the plate 43 and grid 50. One output-reset terminal B is connected to plate 43 and a second output-reset terminal C is connected to plate 45.

In the arrangement disclosed herein by way of example, it will be assumed that a trigger is in its Off state, which may also be considered its normal state or its reset state, if the right-hand triode section is conducting, and such a condition is specified by the X in the lower right-hand corner of the symbol of Figs. 1 and 2*b*. Referring to Fig. 2*a*, with the right-hand triode section conducting, the potential at plate 45 will be relatively low, at output-reset terminal C and also at grid 49 of the left-hand triode section, so that the state is maintained. When a negative-going pulse of sufficient amplitude is supplied to the input terminal A, there is a corresponding negative shift of the potential at both grids. In the case of the left-hand triode section, the tendency is to drive grid 49 even more negative, maintaining the left-hand section cut off. The right-hand triode section grid 50 is driven negative beyond cut off, so that the right-hand triode section is cut off, and the voltage at the plate rises abruptly, with a concomitant rise in voltage at output-reset terminal C and at grid 49 of the left-hand triode section. The left-hand triode section then goes into conduction, so that the voltage at plate 43 drops, thereby lowering the voltage at output-reset terminal B, as well as at grid 50 of the right-hand triode section, which further maintains this section cut off. The trigger is now in its second stable state, or On state.

With the trigger On, a negative pulse supplied to input terminal A will cause the left-hand triode section to cut off, following which the right-hand side conducts, so that the trigger switches to its Off state.

From the foregoing, it is apparent that the trigger shown can function as a binary counting device, transferring from one of its two states to the opposite state each time a negative-going pulse is supplied to the input terminal.

To reset the trigger in a given one of its two stable states, a negative potential is supplied to one of the two output-reset terminals B or C. This insures that the side of the trigger desired to conduct is placed in that condition. For example, if a trigger should be On, and a negative voltage is applied to the output-reset terminal C, the voltage at the plate 45 will be reduced, as well as the voltage at grid 49. The left-hand section cuts off, allowing the voltage at grid 50 of the right-hand section to rise. When the negative reset potential is removed, the right-hand triode section promptly conducts and maintains the left-hand triode section cut off, so that the trigger is set to its Off state. If the trigger were already Off, the application of the negative set pulse to terminal C would have no effect on the circuit.

Similarly, a negative pulse supplied to terminal B will set the trigger On, if it is not already On.

Having thus explained the mode of operation of the triggers, the operation of the counting system will now be explained. The apparatus is shown in its initial or normal condition, with a value of $2^m - n = 0$, i.e., a zero value, set in the presetting chain. All triggers in the presetting chain are in their Off state, a condition obtained as the result of the presetting switches SW1, SW2, SW4, SW8, SW16 and SW32, being positioned to their right-hand or zero position, and closure of reset button RB so that negative potential is supplied from terminal —V to the right-hand output-reset terminal of triggers P1, P2, P4, P8, P16, and P32, through the blocking diodes. This same connection 33 is also made to the right-hand output-reset terminal of the counting chain triggers C2, C4, C8, C16, C32 and C64, through the associated blocking diodes, so that these triggers are also set to their Off position.

If a negative-going initial setting pulse is now supplied to terminal 29, it will be supplied via Or circuit 20 to And circuits 11 through 16, but will not be passed by any of these And circuits, since the triggers in the presetting chain are all Off, and the outputs thereof which are connected to the And circuits are all relatively positive, so that no negative coincidence exists for any of And circuits 11 through 16.

If negative-going pulses are now supplied to terminal 10, the counting chain counts in ordinary binary fashion, the first two pulses turning trigger C2 On and then Off, so that the second input pulse provides a negative-going output pulse from trigger C2 which is effective to turn trigger C4 On. The fourth input pulse causes trigger C4 to turn Off, thereby turning C8 On, and so on, each of the subsequent stages producing a negative-going output pulse for the next higher power of 2 corresponding to the number of input pulses. The 64th input pulse restores all counting chain triggers Off, and accordingly, produces a negative-going output pulse from trigger 64 via capacitor 24 to terminal 28. This pulse is also supplied to the input of trigger P1, via line 36, causing this trigger to turn On, so that the left-hand output-reset terminal thereof assumes a relative negative potential, as does the left input connection of And circuit 11. Thus, following a count of $2^m$ or 64 pulses, a count of $2^m-n+1=1$ is automatically set into the presetting chain.

The same output pulse is supplied via the delay device 31 to the lower input connection of Or circuit 20. The delay device 31 is constructed and arranged so that the pulse is delayed by a sufficient amount to permit the entire presetting chain to change state, if necessary, and then supplied to the And circuits 11 through 16. Since only And circuit 11 has a relative negative potential on its other input, only this circuit will pass a negative pulse, which is transmitted via Or circuit 1 to the inout of trigger C2 in the counting chain. Trigger C2 is set On, equivalent to counting in one input pulse. If input pulses are now supplied to terminal 10, the counting chain will continue the count from a value of one, so that 63 input pulses will now cause an output pulse. This output pulse, supplied via connection 36 to trigger P1, will turn trigger P1 Off, which in turn will turn trigger P2 On. The delayed pulse will now be passed by And circuit 12 to trigger C4, so that this trigger is turned On in the same manner as two input pulses would do is supplied to terminal 10. Accordingly, the next group of input pulses will cause an output pulse following the 62nd input pulse. The process continues in this fashion, each output pulse increasing the count in the presetting chain by one, which value is then set in the counting chain to decrease by one the number of input pulses required to produce the next output pulse, and so on. In the present instance, the input pulse required to produce an output pulse will diminish until a single input pulse will produce an output pulse. At this time, an output pulse will also be produced at terminal 26, which can be employed for any suitable purpose such as stopping the counting operation altogether, or for controlling the entry of the same or a different value of $2^m-n$ in the presetting chain.

In the operation described above, the presetting chain was set to an initial value of zero before the counting operation. By operating the switches associated with the triggers in the presetting chain to their left-hand positions prior to closing the push button RB, any selected number $2^m-n$ from zero to $2^m-1$ may be inserted in the presetting chain, so that a value of $n$ pulses is initially required before producing the first output pulse. Taking as a first example, $n=48$ ($2^m-n=16$), the switch SW16 should be closed to the left when button RB is closed, with all other switches closed to the right. Accordingly, the trigger P16 would be set On while triggers P1, P2, P4, P8 and P32 would be set Off, as would be each counting chain trigger. The initial preset pulse supplied via terminal 29 and Or circuit 20 is passed only by And circuit 15 to thereby turn trigger C32 On. When 16 input pulses are thereafter supplied to input terminal 10, a negative-going pulse is supplied from trigger C16 to trigger C32 via Or circuit 5. Since trigger C32 is already On, this pulse turns it Off, resulting in a pulse being supplied to trigger C64 via Or circuit 6. When 32 additional input pulses are supplied to input terminal 10, a negative-going pulse is supplied from trigger C64 to output terminal 28, to the input of trigger P1, and via the delay device 31 to the input of trigger C2, since trigger P1 will then be On. Since trigger P16 is still On, the delayed output pulse will also be supplied to the input of trigger C32 to turn it On again. Thus a count of 17 is effectively preset in the counting chain, so that the next group of input pulses will produce an output following the 47th pulse, and so on.

As a second and final example, consider the instance in which all the presetting chain triggers are set on prior to starting the count. The total count would then be equal to $1+2+4+8+16+32=63$. The preset pulse would find all And circuits 11 through 16 enabled since all presetting triggers would be On, hence all triggers in the counting chain would accordingly be set On. The application of a single input pulse thereafter to terminal 10 would cause all triggers in the counting chain to turn Off, one after the other, so that an output pulse would be produced at terminal 28 following the reception of but a single input pulse.

From the foregoing description it is apparent that this invention provides an electrical counter capable of successively diminishing the number of input pulses required to produce an output pulse, by providing a first or counting chain comprising a plurality of stages connected in cascade, each of which is additionally governed by the condition of a second or auxiliary presetting chain of counting elements, whereby successive outputs from the primary or counting chain modify the condition of the auxiliary chain, which in turn governs the primary chain elements to preset a number therein effective to diminish by one the number of inputs required to produce the next output from the counting chain.

It will be apparent to those skilled in the art that the invention is not limited to the use of electronic counting devices, the use of negative pulse logic, nor the use of the radix two. Electromechanical counters, including relays, magnetic counters or other solid state counting devices could be similarly employed. Also positive-going pulses could obviously be employed, and the system could be arranged to operate on a decimal or other number basis rather than a binary basis as shown, by substituting counting elements in each stage which are responsive to decimal or other radix values of numbers of input pulses.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. An electrical counter comprising a first and a second counting chain each having a plurality of counter elements connected in cascade, means for supplying input pulses to be counted to said first chain, an output circuit for said first chain, means for supplying said output pulses from said output circuit for said first chain to the input of said second chain, and coupling means connecting said first and second chains for setting the elements in said first chain to a condition corresponding to the condition of the elements in said second chain in response to each output pulse from said first chain.

2. An electrical counter comprising a first and a second counting chain, each chain including a plurality of bistable counter elements connected in cascade, input circuit means for said first and second chains for supplying thereto pulses to be counted, output circuit means for said first chain, circuit means connecting the output circuit means for said first chain to the input circuit means of said second chain, coupling circuit means associated with corresponding elements in said first and second chains and effective when rendered operative to set the counting elements in said first chain in a condition corresponding to the elements in said second chain, and switching means governed by said output circuit for rendering said coupling means effective.

3. An electrical counter comprising a first and a second chain of counter stages, each chain including a plurality of counter stages connected in cascade, each of said counter stages having an input and an output, the input of a succeeding stage being connected to the output of the preceding stage, input means for supplying signals to be counted to the input of the first stage of said first counter chain, an output circuit connected to the output of the last counter stage in said first counter chain, circuit means connecting the output circuit of said first counter chain to the input of the first stage of said second chain, means for setting each stage of said second counter chain to a selected condition to thereby enter a predetermined number into said second counter chain, and means associated with each stage of said second counter chain for setting the associated stages in said first counter chain to a predetermined condition corresponding to the condition of the stage in said second counter chain.

4. An electrical counter comprising a first and a second chain of binary counting elements connected in cascade, an input circuit for each of said chains for supplying pulses to be counted to the first counting element in the chain, an output circuit for each of said counting chains, circuit means for connecting the output circuit of said first chain to the input circuit of said second chain, coupling circuits, one associated with each corresponding binary counting element in said chains and effective when rendered operative to set each counting element in said first chain to a condition corresponding to the condition of the associated element in said second chain, and switching means governed by the output circuit of said first chain for controlling said coupling circuits.

5. An electrical counter comprising a first and a second chain of corresponding counter stages, the output of each stage being connected to input of the next succeeding stage, means for supplying input pulses to the first stage of said first chain, an output circuit connected to the last stage of said first chain, means for presetting said second chain to a predetermined value, means governed by said second counting chain and the output circuit of said first chain for setting said first counting chain to correspond with said second counting chain following each output pulse from said first chain, and means for supplying pulses from the output of said first chain to the input of said second chain to increase the count contained therein each time said first chain produces an output.

6. An electrical counter comprising, in combination, a first and a second chain of binary counting devices, each of said devices having an input circuit and an output circuit, means for supplying pulses to be counted to the input circuit of the first counting device in said first chain, a counter output circuit connected to the output circuit of the last counting device in said first chain, each of the intermediate counter devices in said chain having its output circuit connected to the input circuit of the following counting device, selector means for supplying presetting potentials to the counting devices in said second chain to thereby preset a selected number in said second chain, coupling circuit means associated with corresponding counting devices in said first and second chains and effective when energized to set each of said counting devices in said first chain in a state corresponding to the state of the associated device in said chain, and switching means connected to said coupling circuit means to render the coupling circuit means effective after a predetermined delay following an output pulse supplied to said counter circuit.

No references cited.